US010014357B2

(12) United States Patent
Seok et al.

(10) Patent No.: US 10,014,357 B2
(45) Date of Patent: Jul. 3, 2018

(54) ORGANIC LIGHT-EMITTING DEVICE AND ORGANIC LIGHT-EMITTING DISPLAY DEVICE USING THE SAME

(71) Applicant: LG Display Co., Ltd., Seoul (KR)

(72) Inventors: Han-Byeol Seok, Soeul (KR); Eun-Jung Park, Goyang-si (KR); Seok-Hyun Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/718,158

(22) Filed: Sep. 28, 2017

(65) Prior Publication Data

US 2018/0097052 A1    Apr. 5, 2018

(30) Foreign Application Priority Data

Sep. 30, 2016 (KR) .................. 10-2016-0127086

(51) Int. Cl.
*H01L 27/32* (2006.01)
*H01L 51/52* (2006.01)
*H01L 51/50* (2006.01)

(52) U.S. Cl.
CPC ........ *H01L 27/3248* (2013.01); *H01L 27/322* (2013.01); *H01L 51/5004* (2013.01); *H01L 51/5203* (2013.01); *H01L 27/3246* (2013.01); *H01L 51/5056* (2013.01); *H01L 51/5072* (2013.01)

(58) Field of Classification Search
CPC ............... H01L 27/322; H01L 27/3246; H01L 27/3248; H01L 51/5203; H01L 51/504; H01L 51/5056; H01L 51/5072
See application file for complete search history.

(56) References Cited

U.S. PATENT DOCUMENTS

| 9,722,001 B2* | 8/2017 | Song ..................... H01L 27/322 |
| 2012/0032155 A1 | 2/2012 | Mitsuya |
| 2014/0117338 A1* | 5/2014 | Cho ..................... H01L 51/5044 257/40 |

(Continued)

FOREIGN PATENT DOCUMENTS

WO    2016/082357 A1    2/2016

OTHER PUBLICATIONS

Extended European Search Report dated Feb. 28, 2018, for corresponding European Application No. 17 19 3441.7.

*Primary Examiner* — Phuc Dang

(74) *Attorney, Agent, or Firm* — Morgan, Lewis & Bockius LLP

(57) ABSTRACT

An organic light-emitting device, including: an anode and a cathode opposite each other, a first stack and a second stack between the anode and the cathode, and a charge generation layer between the first stack and the second stack, the charge generation layer including an n-type charge generation layer and a p-type charge generation layer, wherein the p-type charge generation layer includes one first organic material, wherein the n-type charge generation layer includes a second organic material and an n-type dopant, wherein the n-type charge generation layer is divided into a first region contacting the first stack, a second region contacting the p-type charge generation layer, and a third region between the first region and the second region, and wherein a dopant content of the n-type dopant is stepwise increased in an order of: the first region, the third region, and the second region.

15 Claims, 17 Drawing Sheets

(56) References Cited

U.S. PATENT DOCUMENTS

2015/0188076 A1* 7/2015 Kum .................. H01L 51/5278
257/40
2016/0372695 A1 12/2016 Bi et al.

* cited by examiner

ORGANIC LIGHT-EMITTING DEVICE AND ORGANIC LIGHT-EMITTING DISPLAY DEVICE USING THE SAME

CROSS-REFERENCE TO RELATED APPLICATIONS

This application claims the priority of Korean Application No. 10-2016-0127086, filed on Sep. 30, 2016, the entirety of which is hereby incorporated by reference.

BACKGROUND

1. Technical Field

The present disclosure relates to an organic light-emitting device, and more particularly, to an organic light-emitting device that provides a charge generation layer between a plurality stacks and an organic light-emitting display device using the same.

2. Discussion of the Related Art

As the information age has arrived, the field of displays visually expressing electrical information signals has rapidly developed. To satisfy such a trend, various flat display devices, having excellent performance, e.g., thinness, light weight and low power consumption, have been researched as a substitute for a conventional cathode ray tube (CRT) display device.

As representative examples of flat display devices, there are liquid crystal displays (LCDs), plasma display panels (PDPs), field emission displays (FEDs), organic light-emitting device (OLED) displays, etc. Among these, an OLED display requires no separate light source, and has been considered to be competitive to achieve compactness and good color reproduction.

The organic light-emitting display includes a plurality of sub-pixels, and each sub-pixel includes an organic light-emitting device (OLED). The term "OLED" may also be used to refer to an "organic light-emitting diode." OLEDs are independently driven on a sub-pixel basis, including an anode and a cathode, and a plurality of organic layers between the anode and the cathode. The organic light-emitting device is used for a lighting and a display, including a flexible display device and a transparent display device, because the organic light-emitting device does not require an additional light source.

At least one layer of the organic layers between the anode and the cathode is an organic light-emitting layer. Holes and electrons from the anode and cathode are injected into the organic light-emitting layer, and are combined with each other in the organic light-emitting layer, thus generating excitons. When the generated excitons are changed from an excited state to a ground state, the organic light-emitting diode emits light.

Recently, a tandem-type organic light-emitting device, having a plurality of stacks between an anode and a cathode and a charge generation layer between two stacks, has been introduced to improve efficiency of an organic light-emitting device having a single stack between an anode and a cathode.

However, in the tandem-type organic light-emitting device, transportability of electrons is relatively slower than transportability of holes in an emitting layer of the stack, which is far from the cathode. Thus, an emission efficiency is lowered and differences of transportability between holes and electrons in the emitting layers becomes greater as time passes. Therefore, a balance between holes and electrons in the emitting layer collapses, and then, it is difficult to have a long lifespan of the device.

SUMMARY

Accordingly, the present disclosure is directed to an organic light-emitting device and an organic light-emitting display device using the same that substantially obviate one or more of the issues due to limitations and disadvantages of the related art.

In one aspect, embodiments of the present disclosure may provide an organic light-emitting device that provides a charge generation layer between a plurality stacks, including an n-type dopant whose content is changed within the charge generation layer to increase transportability of electrons, and an organic light-emitting display device using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting device, including: an anode and a cathode opposite each other, a first stack and a second stack between the anode and the cathode, and a charge generation layer between the first stack and the second stack, the charge generation layer including an n-type charge generation layer and a p-type charge generation layer, wherein the p-type charge generation layer includes one first organic material, wherein the n-type charge generation layer includes a second organic material and an n-type dopant, wherein the n-type charge generation layer is divided into a first region contacting the first stack, a second region contacting the p-type charge generation layer, and a third region between the first region and the second region, and wherein a dopant content of the n-type dopant is stepwise increased in an order of: the first region, the third region, and the second region.

In another aspect, there is provided an organic light-emitting device, including: an anode and a cathode opposing each other, a first stack and a second stack between the anode and the cathode, and a charge generation layer between the first stack and the second stack, the charge generation layer including an n-type charge generation layer and a p-type charge generation layer, wherein the p-type charge generation layer includes one first organic material, wherein the n-type charge generation layer includes a second organic material and an n type dopant, wherein the n-type charge generation layer is divided into a first region contacting the first stack, a second region contacting the p-type charge generation layer, and a third region between the first region and the second region, wherein the n-type dopant is only in the second region and the third region, and wherein a dopant content of the n-type dopant in the second region is greatest within the n-type charge generation layer.

In another aspect, there is provided an organic light-emitting display device, including: a substrate including a plurality of subpixels, a thin-film transistor in each subpixel on the substrate, and an organic light-emitting device at each sub-pixel, the organic light-emitting device including: an anode and a cathode opposing each other, a first stack and a second stack between the anode and the cathode, and a charge generation layer between the first stack and the second stack, wherein the thin-film transistor contacts the anode or the cathode, wherein the charge generation layer includes: an n-type charge generation layer, and a p-type charge generation layer, wherein the p-type charge generation layer includes one first organic material, wherein the n-type charge generation layer includes a second organic material and an n-type dopant, wherein the n-type charge generation layer is divided into a first region contacting the first stack, a second region contacting the p-type charge generation layer, and a third region between the first region and the second region, and wherein a content of the n-type dopant is stepwise increased in an order of: the first region, the third region, and the second region.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain various principles of the disclosure.

Figure 1:
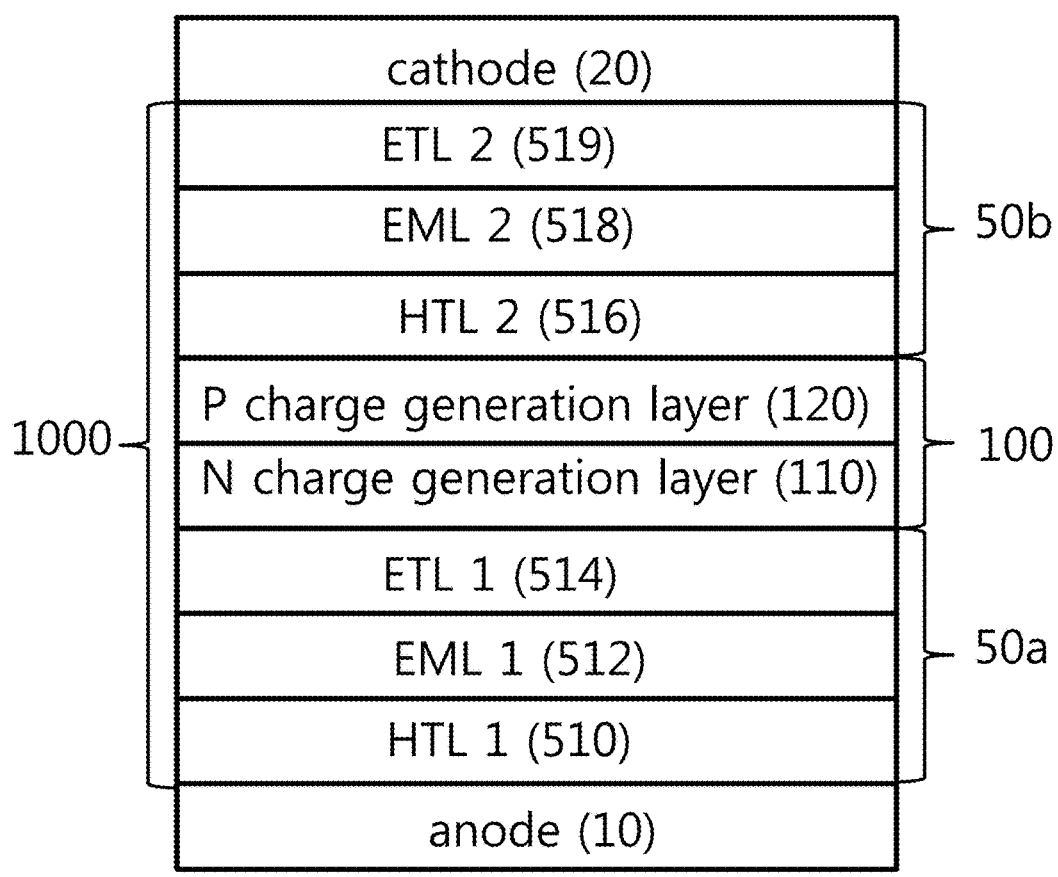
FIG. 1 is a cross-sectional view illustrating an organic light-emitting device in accordance with a first example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of which are illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

In the present disclosure, the "lowest unoccupied molecular orbital (LUMO) energy level" and the "highest occupied molecular orbital (HOMO) energy level" of any layer indicate the LUMO energy level and the HOMO energy level of a material that occupies the greatest weight percentage of the corresponding layer, for example, a host material, and do not refer to the LUMO energy level and the HOMO energy level of a dopant material doped on the corresponding layer unless otherwise mentioned.

In the present disclosure, the "HOMO energy level" may be the energy level measured by cyclic voltammetry (CV) that determines the energy level from a potential value relative to a reference electrode, the potential value of which is known. For example, the HOMO energy level of any material may be measured using ferrocene, the oxidation potential value and the reduction potential value of which are known, as a reference electrode.

In the present disclosure, the term "doped" indicates that the material that occupies the greatest weight percentage of any layer is added with a material that has a different physical property (for example, an N-type or P-type or an organic material or an inorganic material) from that of the material that occupies the greatest weight percentage in an amount corresponding to a weight percentage less than 10%. In other words, a "doped" layer indicates a layer, the host material and the dopant material of which may be distinguished from each other based on the weight percentages thereof. In addition, the term "undoped" refers to all cases excluding the case corresponding to the term "doped." For example, when any layer is formed of a single material or is formed of a mixture of materials having the same or similar properties, the layer belongs to the "undoped" layer. For example, when at least one constituent material of any layer is of a P-type and all other constituent materials of the layer are not of an N-type, the layer belongs to the "undoped" layer. For example, when at least one constituent material of any layer is an organic material and all other constituent materials of the layer are not an inorganic material, the layer belongs to the "undoped" layer. For example, when any layer is mainly formed of organic materials, at least one material of the layer is of an N-type and at least one other material of the layer is of a P-type, the layer belongs to the "doped" layer when the weight percentage of the N-type material is less than 10% or the weight percentage of the P-type material is less than 10%.

In the present disclosure, an electroluminescence (EL) spectrum is calculated by multiplying (1) a photoluminescence (PL) spectrum that reflects the unique properties of a luminescent material, such as a dopant material or a host material included in an organic light-emitting layer, by (2) an outcoupling spectral emittance curve that is determined based on the structure of an organic light-emitting element including the thicknesses of organic layers such as, for example, an electron transport layer, and optical properties thereof.

In present disclosure, the term "stack" refers to a unit structure that includes organic layers such as a hole transport layer and an electron transport layer and an organic light-emitting layer interposed between the hole transport layer and the electron transport layer. The organic layers may further include a hole injection layer, an electron blocking layer, a hole blocking layer, and an electron injection layer, and may further include other organic layers according to the structure or design of the organic light-emitting element.

Figure 2:
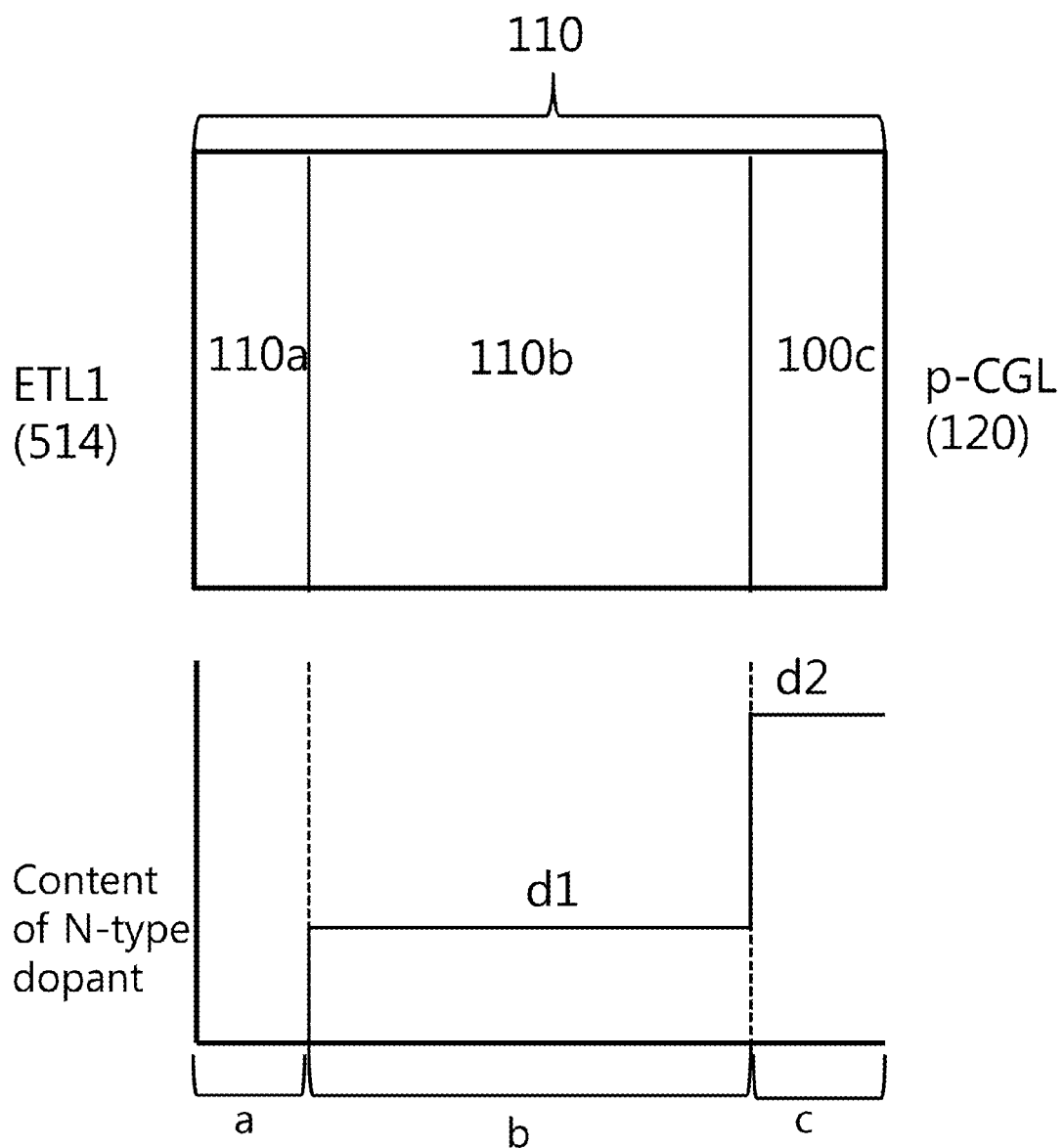
FIG. 2 shows a structure and content of the n-type charge generation layer in FIG. 1.

FIG. 1 is a cross-sectional view illustrating an organic light-emitting device in accordance with a first example embodiment of the present disclosure. FIG. 2 shows a structure and content of the n-type charge generation layer in FIG. 1.

As shown in FIG. 1, an organic light-emitting device according to a first example embodiment may include an anode 10 and a cathode 20 facing each other, a first stack 50a and a second stack 50b between the anode 10 and the cathode 20, and a charge generation layer 100 between the first stack 50a and the second stack 50b. The charge generation layer 100 may include an n-type charge generation layer 110 and a p-type charge generation layer 120. In one example, the charge generation layer 100 may consist of the n-type charge generation layer 110 and the p-type charge generation layer 120.

In one example, the p-type charge generation layer 120 may include one first organic material, and the n-type charge generation layer 110 may include a second organic material and an n-type dopant. Also, the p-type charge generation layer 120 may consist of the one first organic material.

As shown in FIG. 2, the n-type charge generation layer 110 may be divided into a first region 110a contacting the first stack 50a, a second region 100c contacting the p-type charge generation layer 120, and a third region 110b between the first region 110a and the second region 110c. A content of the n-type dopant according to the first embodiment of the organic light-emitting device may exist in the third region 110b and the second region 110c, and the dopant content of the n-type dopant may be highest in the second region 110c of the n-type charge generation layer 110.

Meanwhile, the charge generation layer (CGL) 100 may be referred to as an "intermediate connector layer" because the charge generation layer 100 may control a balance of holes and electrons between the first stack 50a and the second stack 50b. In one example, the n-type charge generation layer 110 may help an injection of electrons into the first stack 50a, and the p-type charge generation layer 120 may help an injection of holes into the second stack 50b.

For example, the p-type charge generation layer 120 may include a single first organic material. The single first organic material may be the same as a material of a second hole transport layer (HTL2) 516 in the second stack 50b. The single first organic material of the p-type charge generation layer 120 may be any one among a fused aromatic group of a heterocyclic compound having at least one of Cyanide (CN) and Fluoride (F), or an allyl compound. In one example, the p-type charge generation layer 120 may consist of the single first organic material.

Also, the second organic material included in the n-type charge generation layer 110 may be an organic material having electron transportability. In one example, the second organic material may include a fused aromatic group of a heterocyclic compound. For example, the second organic material may be an oxadiazole derivative, an antracene derivative, or may be one of: $Alq_3$, PBD, TAZ, Spiro-PBD, BAlq, SAlq, PF-6P, BMB-3T, CO, and TBPI.

In addition, the n-type dopant included in the n-type charge generation layer 110 may be an alkali metal or an alkali earth metal or an n-type organic dopant. As an example, the n-type organic dopant may be any one of: $Cr2hpp_4$ (hpp: 1,3,4,6,7,8-hexahydro-2H-pyrimido[1,2-a] pyrimidine anion), $Fe_2hpp_4$, $Mn_2hpp_4$, $Co_2hpp_4$, $Mo_2hpp_4$, $W_2hpp_4$, $Ni_2hpp_4$, $Cu_2hpp_4$, $Zn_2hpp_4$, $W(hpp)_4$, 4,4',5,5'-tetracyclohexyl-1,1',2,2',3,3'-hexamethyl-2,2',3,3-tetrahydro-1H,1'H-2,2'-biimidazole or 2,2'-diisopropyl-1,1',3,3'-tetramethyl-2,2',3,3',4,4',5,5',6,6',7,7'-dodecahedro-1H,1'H-2,2'-bibenzo'[d]imidazole:2,2'-diisopropyl-4,4',5,5'-tetrakis (4-methoxyphenyl)-1,1',3,3'-tetramethyl-2,2',3,3'-tetrahydro-1H,1'H-2,2'-biimidazole or 2,2'-diisopropyl-4,5-bis(2-methoxyphenyl)-4',5'-bis(4-methoxyphenyl)-1,1',3,3'-tetramethyl-2,2',3,3'-tetrahydro-1H,1'H-2,2'-biimidazole), and 2,2'-diisopropyl-4,5-bis(2-methoxyphenyl)-4',5'-bis(3-methoxyphenyl)-1,1',3,3'-tetramethyl-2,2',3,3'-tetrahydro-1H,1'H-2,2'-biimidazole.

Also, in the n-type charge generation layer 110, the dopant content of the n-dopant may be stepwise ratcheted up in an order of: the first region 110a, the third region 110b, and the second region 110c. That is, the n-type charge generation layer 110 may be divided into a plurality of regions having different contents of the n-type dopant. In each region, a same content may remain.

As shown in the FIG. 2 example, the organic light-emitting device according to the first example embodiment may include the first region 110a having no n-type dopant. The first region 110a may contact the first stack 50a. That is, the second organic material may be provided only for a certain thickness to form the first region 110a, and then n-dopant may be further provided with the second organic material to form the third region 110b and the second region 110c by applying different contents of the n-type dopant to increase contents of the n-dopant when forming the n-type charge generation layer 110. As such, the dopant content of the n-type dopant may be stepwise ratcheted up in an order of: the first region 110a, the third region 110b, and the second region 110c.

In one example, the dopant content "d1" of the n-type dopant between the first region 110a and the third region 110b may be smaller than the dopant content difference "d2−d1" of the n-type dopant between the third region 110b and the second region 110c so that the n-type dopant in the n-type charge generation layer 110 may be relatively concentrated at an interface of the n-type charge generation layer 110 and the p-type charge generation layer 120. As such, the electrons from the p-type charge generation layer 120 may quickly enter the n-type charge generation layer 110 by causing a quantum tunneling effect through a sharp change of a conduction band energy at an interface between the p-type charge generation layer 120 and the n-type charge generation layer 110. In the n-type charge generation layer 110, the n-type dopant may be locally concentrated at the second region 110c, which may contact the p-type charge generation layer 120, which may provide a short tunnel in which the electrons may pass, regardless of an energy barrier in the second region 110c. That is, from the second stack 50b, electrons can easily tunnel an energy barrier caused by a difference of LUMO energies between the second organic material of the n-type charge generation layer 110 and the first organic material of the p-type charge generation layer 120. Therefore, transport of electrons from the second stack 50b to the first stack 50a may be fast due to a short tunnel between the p-type charge generation layer 120 and the n-type charge generation layer 110, and an efficiency of the organic light-emitting device may be increased.

Because the p-type charge generation layer 120 may include a single first organic material, HOMO and LUMO energies may be respectively maintained in the p-type charge generation layer 120. Also, the HOMO and LUMO energies of the second organic material included in the n-type charge generation layer 110 may be pre-determined according to the material of the second organic material. The second organic material may be a main material in the n-type organic generation layer 110 to help to generate electrons and transport electrons. The HOMO and LUMO energies of the second organic material may be the same as or similar to that of the electron transport layer of the first stack 50a. Further, the second organic material may be different from the first organic material due to their respective transportability. Thus, the HOMO and LUMO energies of the second organic material may be respectively different from those of the first organic material. The HOMO and the LUMO energies of the second organic material in the n-type charge generation layer 110 may be respectively in a higher state than the HOMO and the LUMO energies of the first organic material of the p-type charge generation layer 120. Meanwhile, because the n-dopant is included in the n-type charge generation layer 110, the LUMO energy may be changed within the n-type charge generation layer 110. In addition, because the dopant content of the n-dopant may be different according to regions 110a, 110b, 110c, and because of the thicknesses of the regions 110a, 110b, 110c in the n-type charge generation layer 110, the changed LUMO energy may be differently changed according to the first, third, and second regions 110a, 110b, 110c. Further, the LUMO energy may be more differently changed in the n-type charge generation layer 110 when a current is applied between the anode 10 and the cathode 20, and then electrons and holes may be moved between the first stack 50a and the second stack 50b. In view of further providing an inorganic n-dopant into the n-type charge generation layer 110 in embodiments of the present disclosure, the LUMO energy of the n-type charge generation layer may also be referred to as a "conduction band energy."

In an example, a thickness "a" of the first region 110a may occupy 5% to 25% of a total thickness of the n-type charge generation layer 110. This means the single second organic material without n-type dopant may be 5% to 25% of the thickness of the region that may contact the first stack 50a in the n-type charge generation layer 110. Because the first region 110a may have the same or similar LUMO energy as the LUMO energy of the electron transport layer 514 of the first stack 50a, electrons in the n-type charge generation layer 110 may easily move to the electron transport layer 514 of the first stack 50a. The thickness "a" of the first region 110a of the n-type charge generation layer 110 may occupy at least 5% of the total thickness of the n-type charge generation layer 110 to have a limitedly-doped region within the n-type charge generation layer 110. Further, the thickness "a" of the first region 110a of the n-type charge generation layer 110 may occupy less than or equal to 25% of the total thickness of the n-type charge generation layer 110 because it may be difficult to make a charge balance in the doped region(s) when the thickness "a" of the first region 110a is greater than 25% of the total thickness of the n-type charge generation layer 110.

The second region 110c may have the greatest content of the n-type dopant in the n-type charge generation layer 110. The dopant content of the second region 110c may be about 3 wt % to 10 wt %. A thickness "c" of the second region 110c may occupy 5% to 30% of a total thickness of the n-type charge generation layer 110. This means even the biggest doped region may have a certain thickness contacting the p-type charge generation layer 120. Also, in the second region 110c, which is narrow, the quantum tunneling effect may be generated when the electrons passes from the p-type charge generation layer 120 into the n-type charge generation layer 110.

The third region 110b may be thicker than the first region 110a and the second region 110c, respectively. Thus, the thickness "b" of the third region 110b may be thicker than the thicknesses "a" and "c" of the first and second regions 110a and 110c. That is, the third region may have a greater volume than those of the first and second regions 110a and 110c. This is for decreasing interfaces with adjacent layers and for gaining a sufficiently stable region in the n-type charge generation layer 110. The third region 110b may also be thicker than the first region 110a and the second region 110c combined.

The dopant content of the third region 110b may be less than that of the second region 110c. The dopant content "d1" of the n-type dopant between the first region 110a and the third region 110b may be smaller than the dopant content difference "d2−d1" of the n-type dopant between the third region 110b and the second region 110c. The third region 110b may provide stability in the n-type charge generation layer 110 having the n-type dopants, for example, because a tunneling region through which electrons can pass without an energy barrier may be substantially generated in the second region 110c adjacent to the p-type charge generation layer 120.

Meanwhile, in the example of FIG. 2, the dopant content of the third region 110b of the n-type dopant is illustrated as "d1," and the dopant content of the second region 110c of n-type dopant is illustrated as "d2." The dopant content ratio of the n-type dopant of the third region 110b and the second region 110c in the n-type charge generation layer 110 may be respectively expressed as (b*d1)/(a+b+c) and (c*d2)/(a+b+c). In addition, the dopant content ratio of the n-type charge generation layer 110 may be expressed as (b*d1+c*d2)/(a+b+c). That is, in an example in which the dopant content of the n-type dopant is stepwise increased as shown in the example of FIG. 2, an average content of the n-type dopant in the n-type charge generation layer is less than that of an example in which the dopant content of the n-type dopant is uniformly contained as "d2" in the entire thickness of the n-type charge generation layer 110. This may be expressed as: ((b*d1+c*d2)/(a+b+c)<<d2(a+b+c)/(a+b+c)).

Furthermore, with further reference to the FIG. 1 example, the first stack 50a may include a single structure of a hole transport layer 510, a light-emitting layer 512, and an electron transport layer 514. The second stack 50b may include a single structure of a hole transport layer 516, a light-emitting layer 518, and an electron transport layer 519. Also, a hole injection layer may be added between the anode 10 and the hole transport layer 510, and an electron injection layer may be added between the cathode 20 and the electron transport layer 519. Each layer 510, 512, 514, 516, 518, 519 may be a plurality of layers, as desired.

The anode 10 and the cathode 20 may have transparency or reflectivity, and the materials for the anode 10 and the cathode 20 can be selected, e.g., depending on the light-emitting direction. For example, the materials of these may be selected from metals, such as aluminum, gold, silver, nickel, palladium, and platinum, and from transparent metal oxides, such as indium and/or tin oxides or non-transparent metal oxide. Alternatively, the anode 10 and the cathode 20 may be stacked in layers with these metals. One of the stacked layers of the anode 10 and the cathode 20 may be, e.g., a halogenated metal, such as copper iodide, or include a conductive polymer, such as carbon black or poly (3-methylthiophene), polypyrrole, polyaniline, and the like.

Examples of the material for the hole transporting layers 510 and 516 may include aromatic amine derivatives, phthalocyanine derivatives, porphyrin derivatives, oligothiophene derivatives, polythiophene derivatives, benzylphenyl derivatives, compounds in which a tertiary amine is linked with a fluorene group, hydrazine derivatives, silazane derivatives, silanamine derivatives, phosphamine derivatives, quinacridone derivatives, polyaniline derivative, polypyrrole derivatives, polyphenylene vinylene derivatives, poly (thienylenevinylene) derivatives, polyquinoline derivatives, polyquinoxaline derivatives, and the like.

The organic light-emitting device of the present disclosure may include the light-emitting layers 512 and 518 between the first and second stacks 50a and 50b as a light-emitting layer that emits light of the same color, or the light-emitting layers 512 and 518 between the first and second stacks may be provided as light-emitting layers that emit complementary colors. Such a light-emitting layer may contain a carrier material as a main material, and a dopant of a metal complex as a guest. Materials for the electron transport layers 514 and 519 may include PBD, TAZ, Alq$_3$, BAlq, TPBI, and Bepp$_2$. However, the above examples of the material for the first stack 50a and the second stack 50b are only examples, and embodiments are not limited to these materials.

In the organic light-emitting display device, a color filter may be omitted in a multi-stack structure having light-emitting layers emitting the same color on one sub-pixel. In one example, for different sub-pixels, light-emitting layers of different color may be provided. Further, if each stack of the multi-stack has light-emitting layers of different colors and finally the multi-stack emits a white light, color filters may be provided on or under the multi-stack for a color display. The color filters can be, e.g., a red color filter, a green color filter, and a blue color filter, and a white color filter may be further added, as desired. For example, at least one color filter can be replaced with a different color filter from the red, green, and blue color filters.

Also, reference numeral 1000 in FIG. 1 refers to an organic stack between the anode 10 and the cathode 20. Materials included in the organic stack 1000 may be organic materials. Each layer in the organic stack 100 may be formed, e.g., with a vapor evaporation or a soluble process.

Hereinafter, a comparative example and experimental examples according to example embodiments of the present disclosure are compared.

Figure 3A:
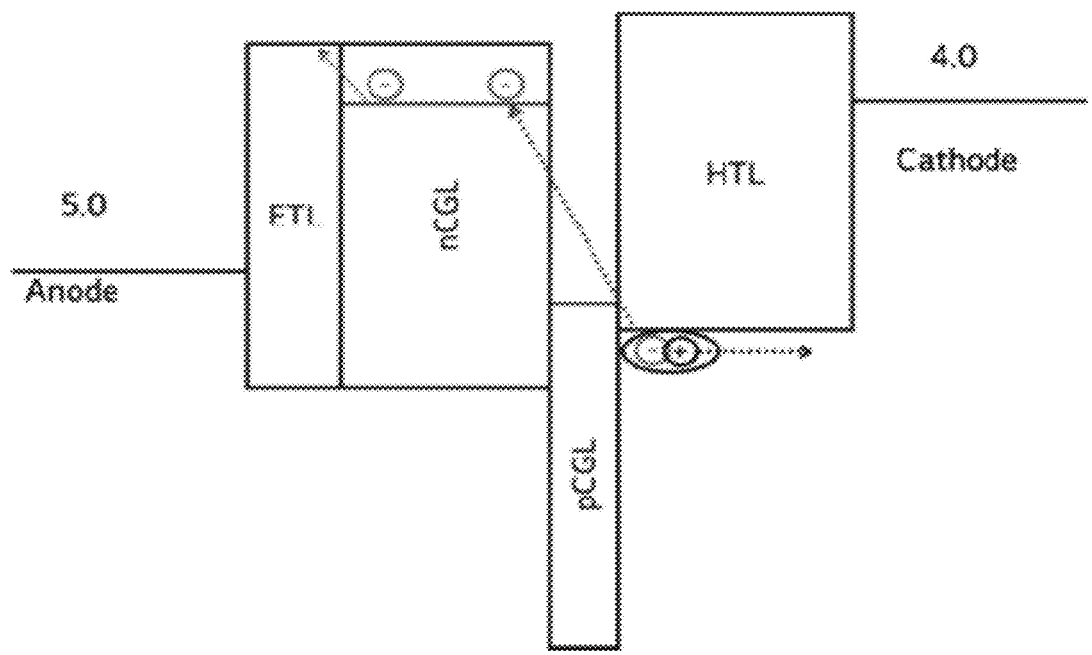
FIG. 3A is a band diagram for a charge generation layer and other layers adjacent to the charge generation layer in accordance with a first comparative example.
Figure 3B:
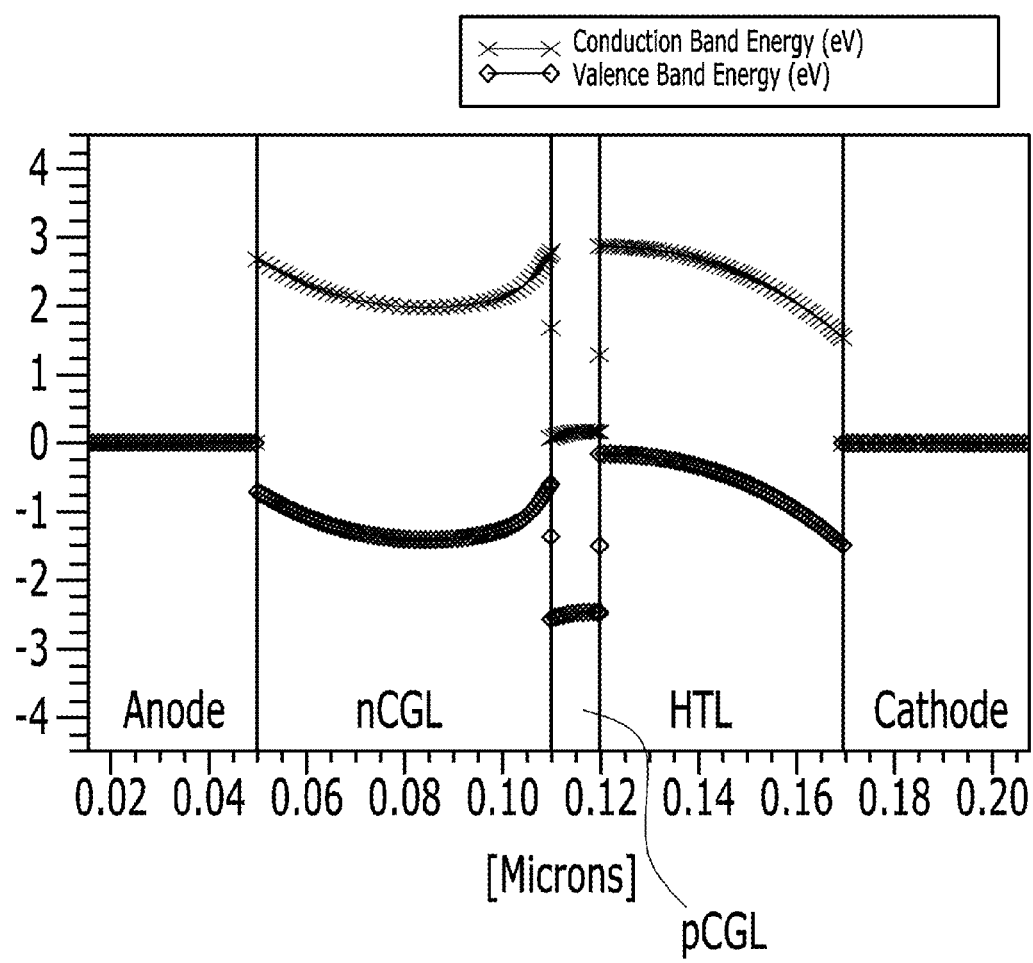
FIG. 3B is a graph illustrating a change of an energy band for a charge generation layer and other layers adjacent to the charge generation layer when a current is applied in accordance with a first comparative example.
Figure 4A:
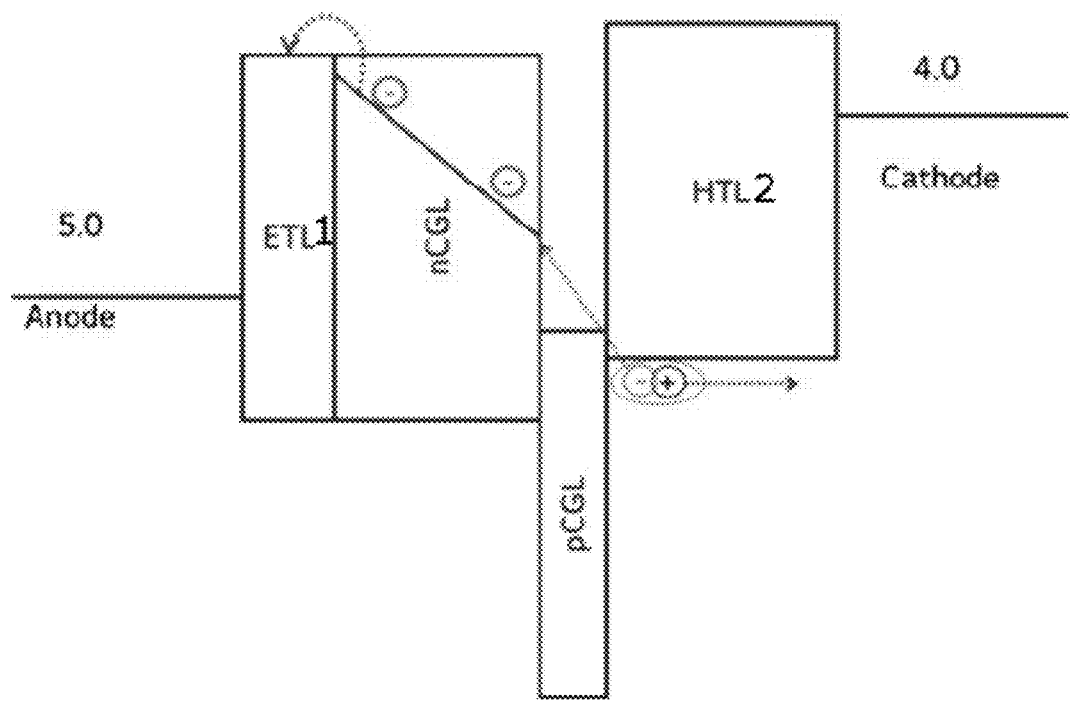
FIG. 4A is a band diagram for a charge generation layer and other layers adjacent to the charge generation layer in accordance with an example embodiment of the present disclosure.
Figure 4B:
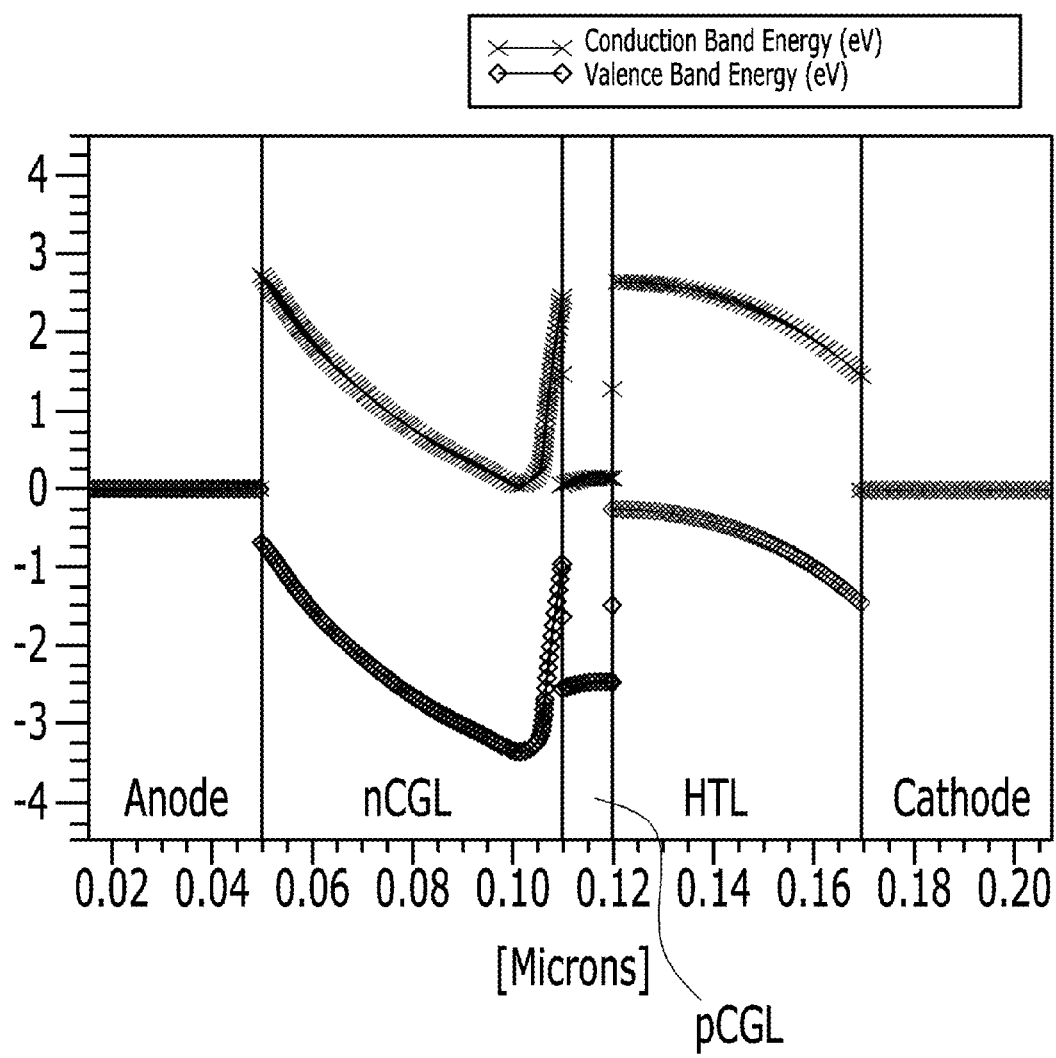
FIG. 4B is a graph illustrating a change of an energy band for a charge generation layer and other layers adjacent to the charge generation layer when a current is applied in accordance with an experimental example.
Figure 5:
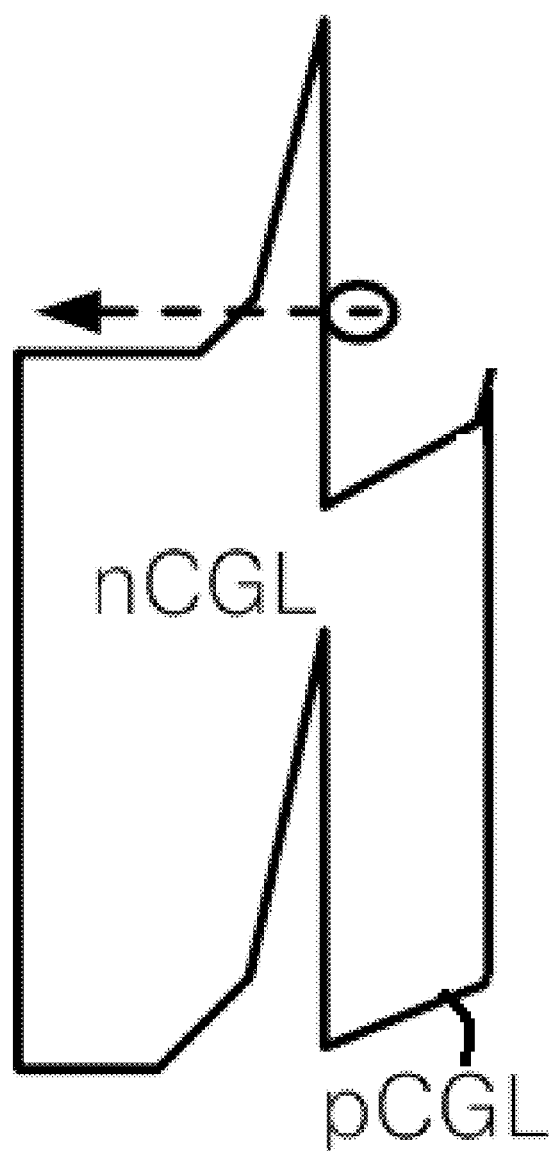
FIG. 5 is an enlarged view illustrating the change of the energy band between the n-type charge generation layer and the p-type charge generation layer in FIG. 4B.

FIG. 3A is a band diagram for a charge generation layer and other layers adjacent to the charge generation layer in accordance with a first comparative example. FIG. 3B is a graph illustrating a change of an energy band for a charge generation layer and other layers adjacent to the charge generation layer when a current is applied in accordance with a first comparative example. FIG. 4A is a band diagram for a charge generation layer and other layers adjacent to the charge generation layer in accordance with an example embodiment of the present disclosure. FIG. 4B is a graph illustrating a change of an energy band for a charge generation layer and other layers adjacent to the charge generation layer when a current is applied in accordance with an experimental example. FIG. 5 is an enlarged view illustrating the change of the energy band between the n-type charge generation layer and the p-type charge generation layer in FIG. 4B.

In the experiments of FIGS. 3A-5, each stack is simplified to be one layer (e.g., an electron transport layer ETL or a hole transport layer) without any light-emitting layer. The experiments are processed to particularly observe movement of electrons in the comparative example and experimental examples of embodiments of the present disclosure. With the exception of the n-type charge generation layer, the layers are applied in the same manner in the comparative example and the experimental examples.

As shown in FIG. 3A, the organic light-emitting device according to the first comparative example has an electron transport layer ETL, an n-type charge generation layer nCGL doped with an n-type dopant at a uniform content in the entire region having a second organic material, a p-type charge generation layer pCGL and a hole transport layer HTL between an anode and a cathode. In the first comparative example, the second organic material of the n-type charge generation layer nCGL is the same as the electron transport layer ETL adjacent to the n-type charge generation layer nCGL. Even though the LUMO energy L2 of the n-type charge generation layer nCGL is lower than the LUMO energy L1 of the second organic material due to doping the n-type dopant, the lowered difference "L1−L2" is less than the LUMO energy difference between the second organic material of the n-type charge generation layer nCGL and a first organic material of the p-type charge generation layer pCGL. One reason for this is because the second organic material is dominant in the n-type charge generation layer nCGL, and the dopant content of the n-dopant may be under a certain value for a main function of the n-type charge generation layer. As shown in FIG. 3B, a change of the LUMO energy (conduction band energy) shows a gentle curve in the n-type charge generation layer when a current is applied between the anode and the cathode. The LUMO energy of the n-type charge generation layer nCGL, as a whole, is higher than the LUMO energy of the p-type charge generation layer pCGL. In this case, a wide band gap acts on the electrons positioned in the p-type charge generation layer pCGL when the electrons enter the n-type charge generation layer nCGL from the p-type charge generation layer pCGL. Therefore, an efficiency of electron transfer is low and a transfer rate of electrons is low.

On the contrary, as shown in FIG. 2 and FIG. 4A, the dopant content of the n-type dopant is changed within the n-type charge generation layer 110 to divide into three regions 110a, 110b and 110c in an example embodiment. In the first region 110a, a single second organic material is provided without the n-type dopant. The first region 110a of the n-type charge generation layer 120 has the same material as the electron transport layer (ETL1) 514. Thus, electrons in the first region 110a may easily move into the electron transport layer (ETL1) 514 because electrons positioned in the first region 110a are in a similar state as the LUMO energy of the electron transport layer (ETL1) 514.

Also, as shown in FIGS. 4B and 5, by increasing the dopant content of the n-type dopant in the stepwise manner, and by making the dopant content of the n-type dopant most abruptly change at the near region 110c with the p-type charge generation layer 120, the LUMO energy (conduction band energy) rapidly rises in the second region 110c adjacent to the p-type charge generation layer 120. As such, when electrons in the p-type charge generation layer 120 substantially enter the n-type charge generation layer 110, electrons at the interface between the p-type charge generation layer 120 and the n-type charge generation layer 110 can easily pass an area having a sharp gradient of the LUMO energy through a quantum tunneling effect. Accordingly, a high tunneling effect is obtained so that electrons can move from the p-type charge generation layer 120 to the n-type charge generation layer 110 with high efficiency in a short time. This is because even if there is an energy barrier in the second region 110c of the n-type charge generation layer 110, in the n-type charge generation layer 110, the region which has a large difference of the LUMO energy from the LUMO energy of the p-type charge generation layer 110 is extremely narrow. Therefore, the electrons can easily and quickly pass the energy band, regardless of the large difference of the LUMO energy between the p-type charge generation layer 110 and the LUMO energy of the second region 110c. Accordingly, the electron transfer rate is increased, and the injection efficiency from the p-type charge generation layer into the n-type charge generation layer is also increased.

If an organic light-emitting device has a plurality of stacks, and if each stack has a light-emitting layer, an injection efficiency of electrons is lowered into the light-emitting layer in the stack that is relatively far from the cathode. Thus, a driving voltage may be increased due to lack of electrons in the stack having the light-emitting layer that is relatively far from the cathode.

The above experiments show that the electron transfer rate and the injection efficiency are improved through the stepwise increasing dopant content in the n-type charge generation layer. Also, such variation of the present disclosure may improve a charge balance between electrons and the holes in a total stack, and thus, can increase a lifespan of the organic light-emitting device. In particular, the inventors of the present disclosure noticed changes of the LUMO levels at both interfaces of the n-type charge generation layer. Hereinafter, modifications of the first embodiment are described.

Figure 6:
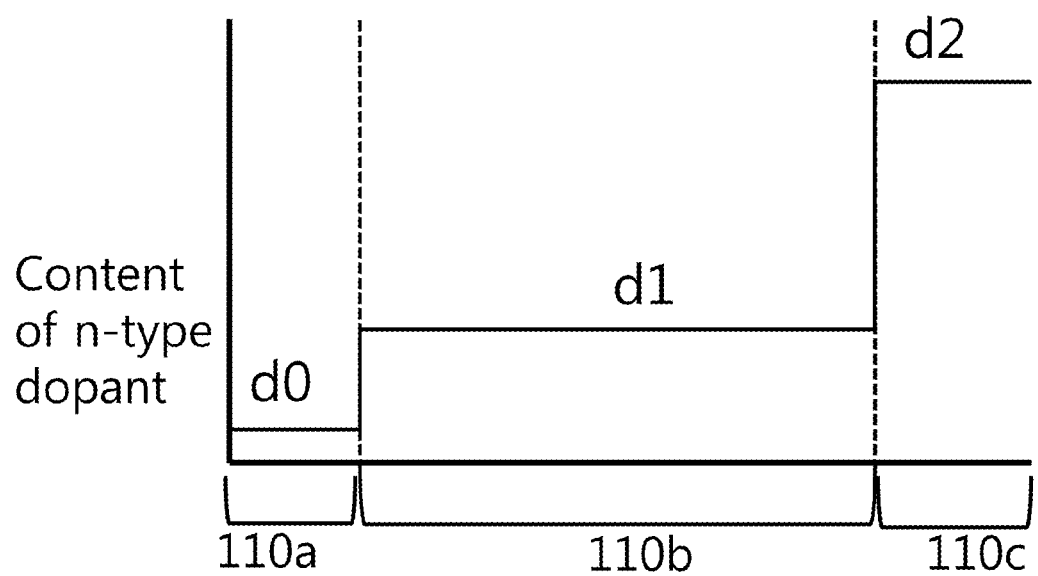
FIG. 6 is a graph showing content of the n-type charge generation layer in accordance with a modification of the first example embodiment of the present disclosure.

FIG. 6 is a graph showing content of the n-type charge generation layer in accordance with a modification of the first example embodiment of the present disclosure.

As shown in FIG. 6, the n-type charge generation layer in accordance with a modification of the first example embodiment may include the first region 110a having a very small (minute) dopant content, e.g., under 0.5 wt %, of the n-type dopant. Similarly to the first example embodiment, a greatest dopant content "d2" of the n-type may be doped in the in the second region 110c, which may contact the p-type charge generation layer 120.

In one example, the dopant content of the n-type dopant of the first region 110a, the third region 110b, and the second region 110c may be stepwise increased (d0→d1→d2). In addition, the dopant content of the third region 110b may be less than that of the second region 110c. In one example, the dopant content difference "d1−d0" of the n-type dopant between the first region 110a and the third region 110b may be less than the dopant content difference "d2−d1" of the n-type dopant between the third region 110b and the second region 110c. The third region 110b may provide stability in the n-type charge generation layer 110 having the n-type dopants, and a tunneling region through which electrons can pass without an energy barrier may be substantially generated in the second region 110c that is adjacent to the p-type charge generation layer 120.

The modification of the first embodiment differs from the first embodiment in that a very small content "d0" of the n-type dopant is added in the first region 110a. In one example, the dopant content of the n-type dopant added to the first region 110a is to a level that does not prevent electrons in the n-type charge generating layer 110 from being transferred to the electron transporting layer 514 of the first stack 50a.

Figure 7:
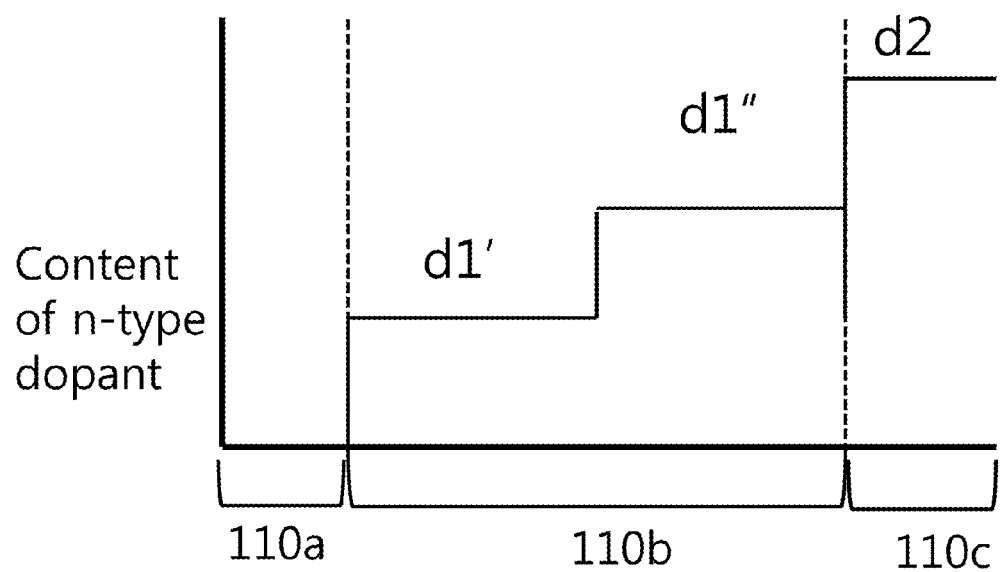
FIG. 7 is a graph showing content of the n-type charge generation layer in accordance with a different modification of the first example embodiment of the present disclosure.

FIG. 7 is a graph showing content of the n-type charge generation layer in accordance with a different modification of the first example embodiment of the present disclosure.

The third region 110b between the first region 110a and the second region 110c may be thicker than the first region 110a and the second region 110c. Further, as shown in the FIG. 7 example, the third region 110b may be divided into a plurality of sub-regions that may have stepwise increased contents d1' and d1" of the n-type dopant therein.

Figure 8:
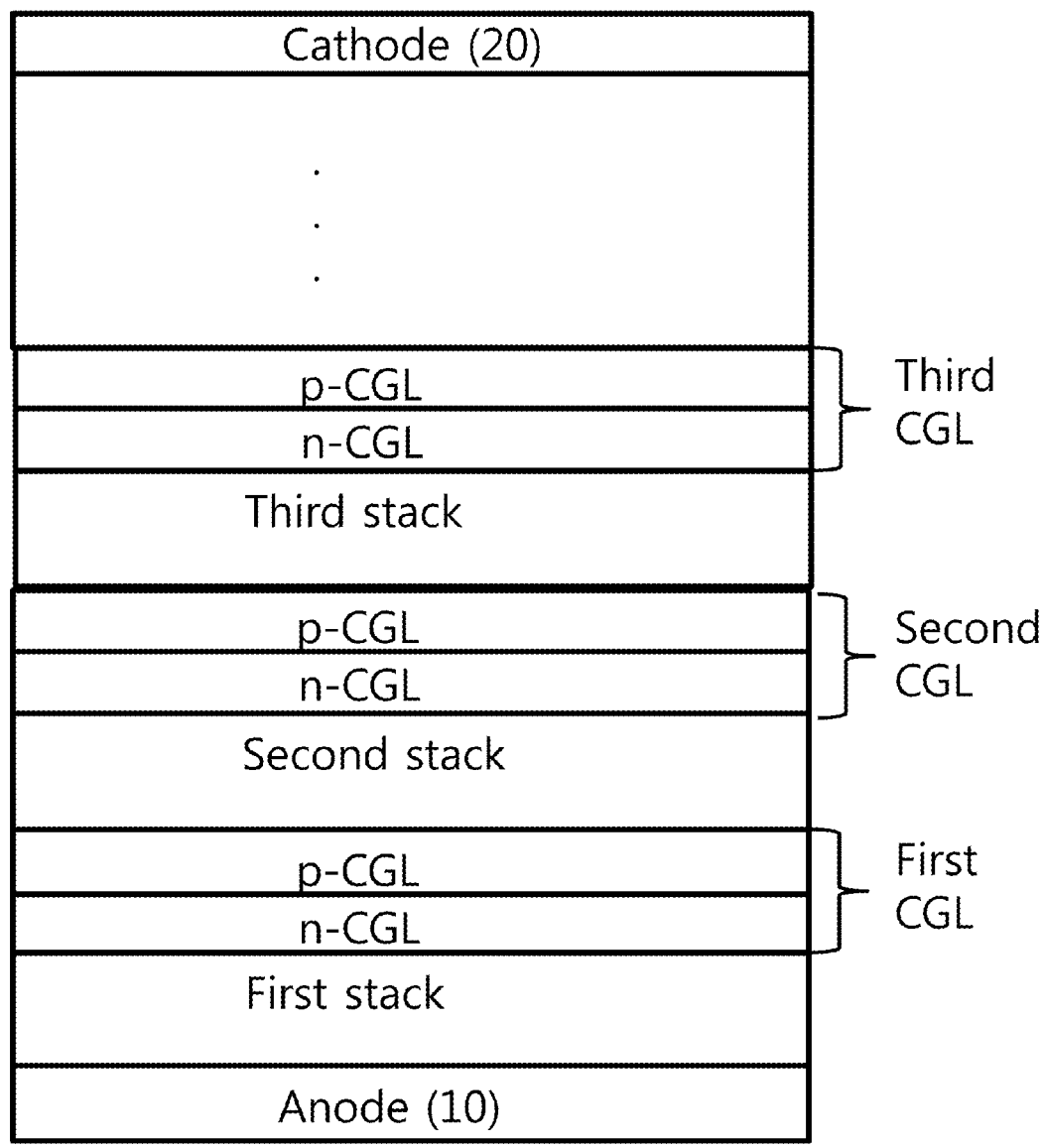
FIG. 8 is a cross-sectional view illustrating an organic light-emitting device in accordance with a second example embodiment of the present disclosure.

FIG. 8 is a cross-sectional view illustrating an organic light-emitting device in accordance with a second example embodiment of the present disclosure.

As shown in FIG. 8, an organic light-emitting device in accordance with the second example embodiment of the present disclosure may have at least one stack more than the first embodiment. Therefore, there may be three or more stacks (e.g., a 1st stack to $n^{th}$ stack) in the organic light-emitting device in accordance with the second example embodiment.

In one example, there may be charge generation layers First CGL, Second CGL, $(n-1)^{th}$ CGL between adjacent stacks, and each charge generation layer may include the n-type charge generation layer n-CGL having a dopant content gradient characteristic into the second organic material and the p-type charge generation layer p-CGL having the single first organic material as described above. For example, the n-type charge generation layer may have same function and effect as the first embodiment described above.

A charge generation layer may include an n-type charge generation layer (n-CGL) and p-type charge generation layer (p-CGL) between the second stack and an adjacent sub-stack or between the sub-stacks. The p-type charge generation layer may include a single first organic material, and the n-type charge generation layer may include a second organic material and an n-type dopant. The n-type charge generation layer may have a first region, a second region in contact with the n-type charge generation layer, and a third region between the first region and the second region. The n-type dopant may be doped only in the second and third regions. The dopant content of the n-type dopant may be the highest in the second region. In one example, the p-type charge generation layer may consist of the single first organic material.

Alternatively, the n-type dopant may be sequentially increased in the order of the first region, the third region, and the second region. In the first region, a n-type dopant may be included in a very small amount. The difference in the dopant content of the n-type dopant between the first region and the third region may be smaller than the difference in the dopant content of the n-type dopant between the third region and the second region.

In addition, in the structure of the second embodiment described above, the light-emitting layers in the plurality of stacks may be all the same, some structures may be the same and the remainder may be different, or all the light-emitting layers may have different structures, e.g., may be light-emitting layers of different colors.

By Table 1 and FIGS. 9A to 11, efficiencies and lifespan of a second comparative example and first to fourth experimental examples are described below.

Figure 9A:
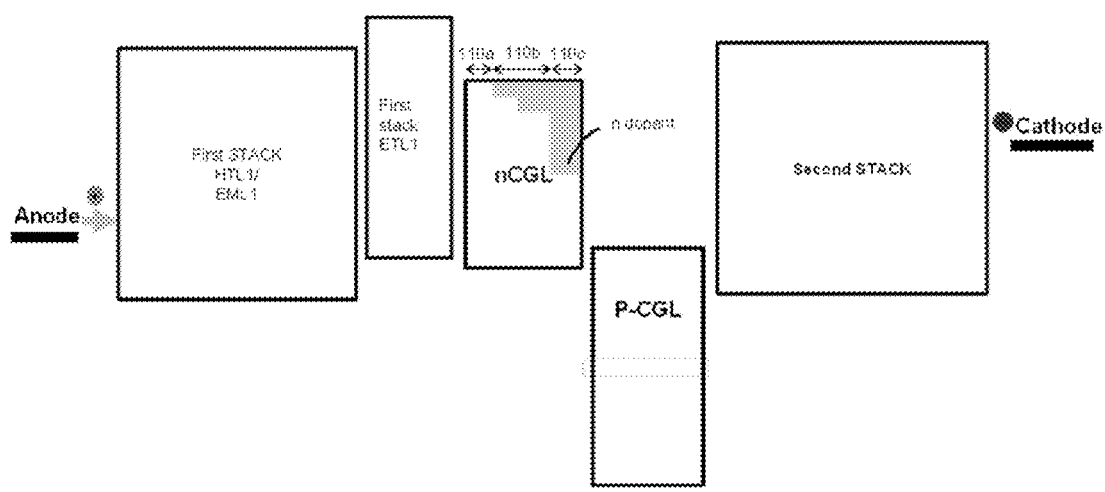
FIGS. 9A-9D are energy diagrams showing the charge generation layer and adjacent layers to the charge generation layer in accordance with example embodiments of the present disclosure.
Figure 9B:
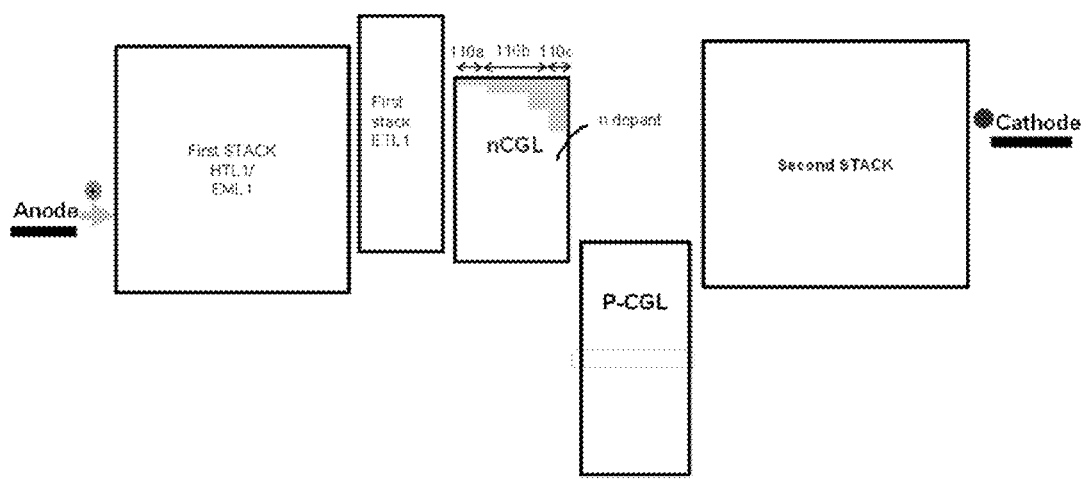
Figure 9C:
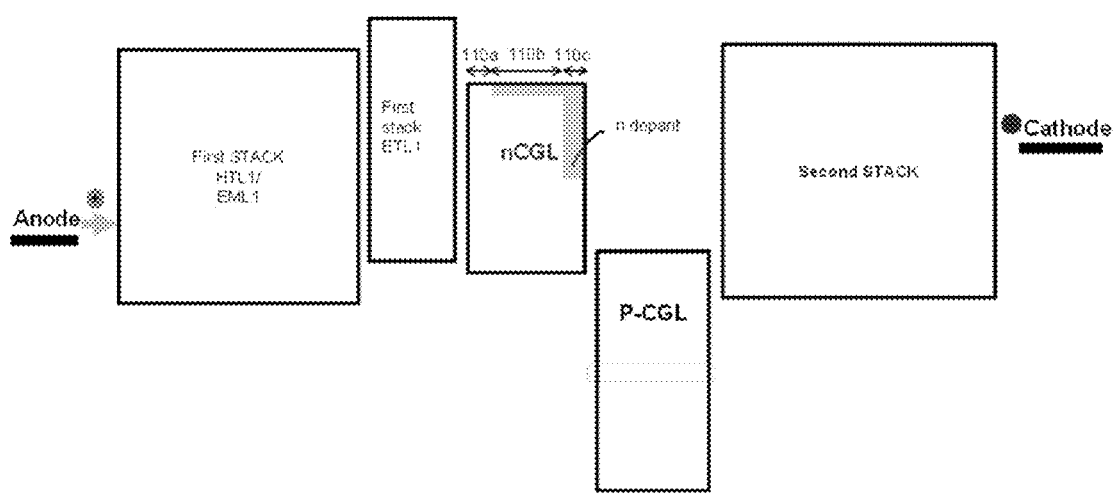
Figure 9D:
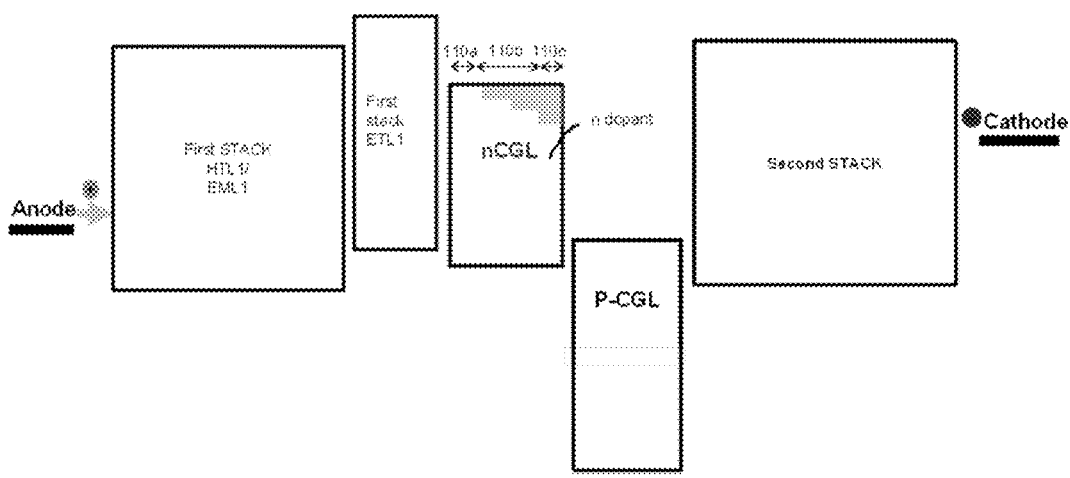
Figure 10:
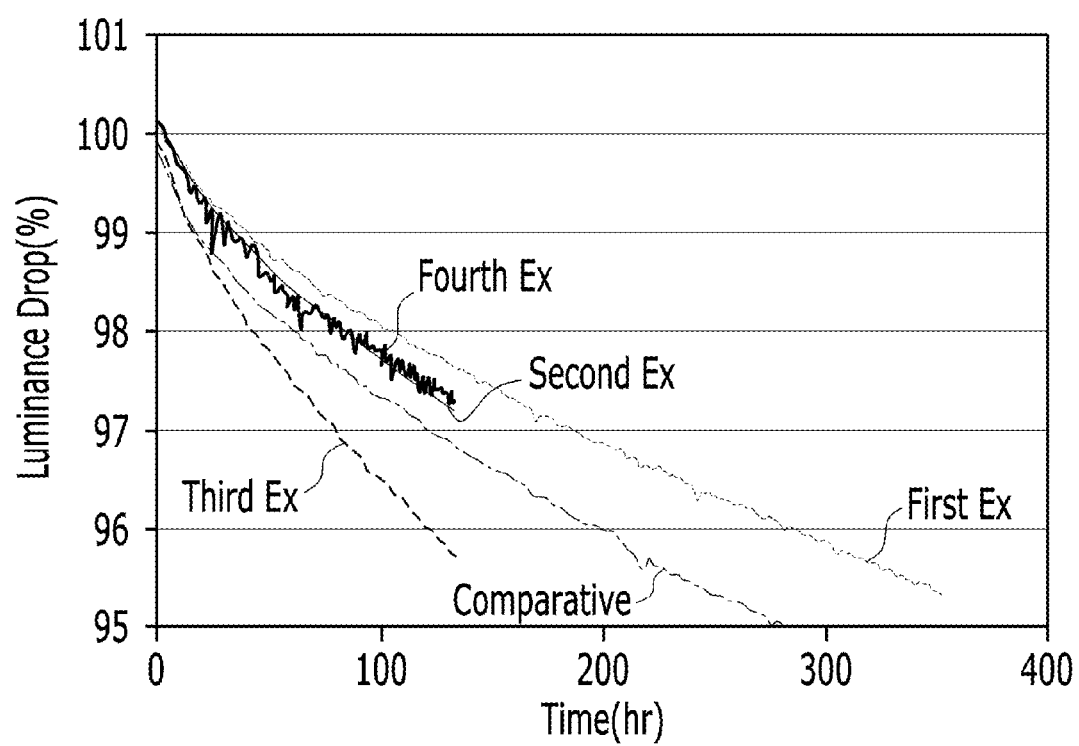
FIG. 10 is a graph illustrating luminance in accordance with a second comparative example and the examples of FIGS. 9A-9D.
Figure 11:
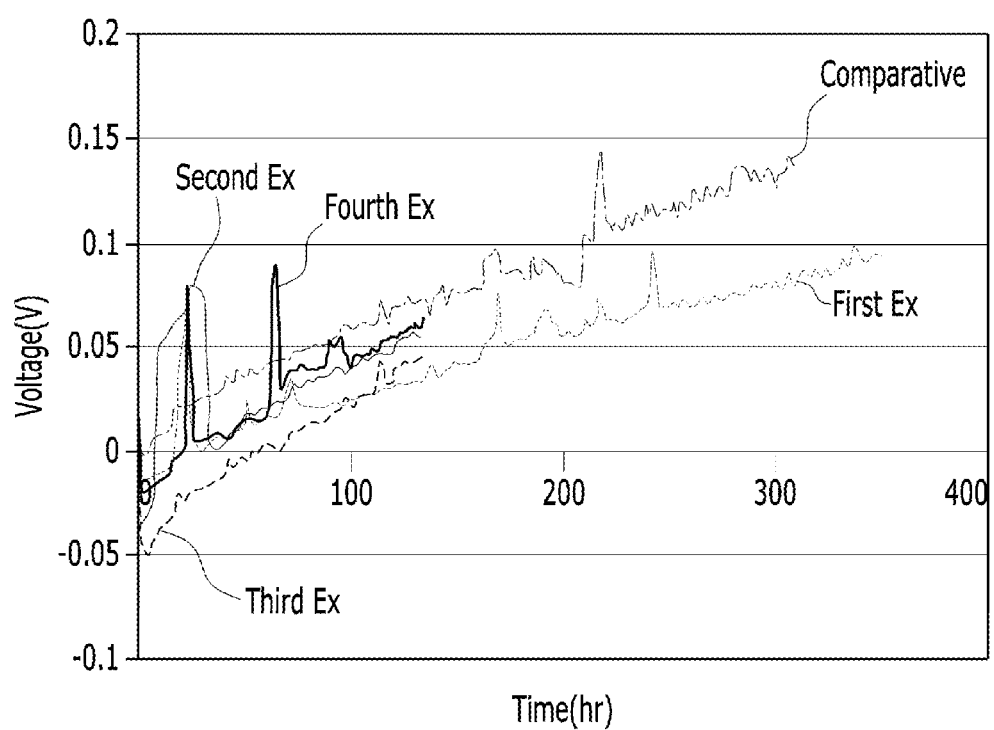
FIG. 11 is a graph illustrating a change in voltage ($\Delta V$) in accordance with the second comparative example and the examples of FIGS. 9A-9D.

FIGS. 9A-9D are energy diagrams showing the charge generation layer and adjacent layers to the charge generation layer in accordance with example embodiments of the present disclosure. FIG. 10 is a graph illustrating luminance in accordance with a second comparative example and the examples of FIGS. 9A-9D. FIG. 11 is a graph illustrating a change in voltage (ΔV) in accordance with the second comparative example and the examples of FIGS. 9A-9D.

Each of the second comparative example and the first to fourth experimental examples has a substantially similar structure, except for the dopant content variation of the n-type dopant in the n-type charge generation layer. That is, each of the second comparative example and the first to fourth experimental examples has a first stack and a second stack between an anode and a cathode, and a charge generation layer including an n-type charge generation layer and a p-type charge generation layer as shown in FIG. 1. Each stack has a hole transport layer, a light-emitting layer, and an electron transport layer. The p-type charge generation layer consists of a first organic material in the second comparative example and the first to fourth experimental examples. Any one of a fused aromatic group of a heterocyclic compound having at least one of Cyanide (CN) and Fluoride (F), or an allyl compound is used for the first organic material. Further, one side of the n-type charge generation layer contacts the electron transport layer of the first stack, and the other side of the n-type charge generation layer contacts the p-type charge generation layer.

In each of the second comparative example and the first to fourth experimental examples, the n-type charge generation layer uses a second organic material of a fused aromatic group of a heterocyclic compound having an electron transport characteristic and an n-type dopant of Li. In each of the second comparative example and the first to fourth experimental examples, the thickness of the n-type charge generation layer is 120 Å.

In the second comparative example, the dopant content of the n-type dopant is 1 wt % in the n-type charge generation layer, and is uniformly applied in the total thickness of the n-type charge generation layer. In the first to fourth experimental examples, each n-type charge generation layer is divided into at least three regions, as shown in the FIG. 2 example.

In the first experimental example, the thickness of the first region is 10 Å and the thickness of the second region is 30 Å and the dopant contents of the n-type dopant in the first and second regions are 0 wt % and 5 wt %, respectively. The thickness of the third region between the first and the second regions is 80 Å, and the third region is further divided into two sub-regions, each having a 40 Å thickness. The dopant contents of the n-type dopant in the two sub-regions of the third region are 1 wt % and 2 wt %, respectively.

In the second experimental example, the thickness of the first region is 30 Å, and the thickness of the second region is 20 Å. The dopant content of the n-type dopant in the first and second regions is 0.5 wt % and 3 wt %, respectively. The thickness of the third region between the first and the second regions is 70 Å. The third region is further divided into two sub-regions respectively having a 50 Å thickness and a 20 Å thickness. The dopant content of the n-type dopant in the two sub-regions of the third region is respectively 1 wt % and 2 wt %.

In the third experimental example, the thickness of the first region is 20 Å, and the thickness of the second region is 20 Å. The dopant content of the n-type dopant in the first and second regions is 0 wt % and 5 wt %, respectively. The thickness of the third region between the first and the second regions is 80 Å, and the dopant content of the n-type dopant in the third region is 1 wt %.

In the fourth experimental example, the thickness of the first region is 30 Å and the thickness of the second region is 30 Å. The dopant content of the n-type dopant in the first and second regions is 0 wt % and 3 wt %, respectively. The thickness of the third region between the first and the second regions is 60 Å. The third region is further divided into two sub-regions, each having a 30 Å thickness. The dopant content of the n-type dopant in the two sub-regions of the third region is 1 wt % and 2 wt %, respectively.

TABLE 1

| Regions | Structure of n-type charge generation (thickness_content) (Å_wt %) | | | Driving voltage (V) | Luminance (Cd/A) | CIEx | CIEy | EQE(%) |
| --- | --- | --- | --- | --- | --- | --- | --- | --- |
| | First region | Third region | Second region | | | | | |
| Second comparative example | | 120_1 | | 7.3 | 12.5(12.8) | 0.136 | 0.066 | 23.2 |

TABLE 1-continued

| Regions | Structure of n-type charge generation (thickness_content) (Å_wt %) | | | Driving voltage (V) | Luminance (Cd/A) | CIEx | CIEy | EQE(%) |
|---|---|---|---|---|---|---|---|---|
| | First region | Third region | Second region | | | | | |
| First experimental example | 10_0 | 40_1  40_2 | 30_5 | 7.2 | 13.2(13.2) | 0.134 | 0.068 | 24.3 |
| Second experimental example | 30_0.5 | 50_1  20_2 | 20_3 | 7.3 | 12.1(12.5) | 0.136 | 0.066 | 22.5 |
| Third experimental example | 20_0 | 80_1 | 20_5 | 7.8 | 11.9(13.1) | 0.139 | 0.060 | 23.4 |
| Fourth experimental example | 30_0 | 30_1  30_2 | 30_3 | 7.5 | 12.4(12.4) | 0.135 | 0.068 | 22.6 |

In Table 1 above, the values indicated in the parentheses "( )" in the luminances are re-calculated values in the condition of CIE_y 0.068 in a display. These mean the luminance value of each of the examples when the same color in an image is adjusted, and the values in parentheses are significant in the display.

As shown in Table 1 and FIGS. 10 and 11, the first experimental example shows a superior lifespan over the comparative example, a lowest driving voltage, and a lowest variation of driving voltage (ΔV). For example, in the first experimental example, the first region of the n-type charge generation layer is a non-doped region, and the dopant content of the second region that contacts the p-type charge generation layer is 3 wt %. Further, the dopant content difference of the n-type dopant between the first region and the third region of 1 wt % is smaller than the dopant content difference of the n-type dopant between the third region and the second region of 2 wt %. In the structure of the first experimental example, the low driving voltage, improvement of efficiencies, and enhanced lifespan is observed. Also, a low variation of the driving voltage (ΔV) is observed. In particular, the low variation of the driving voltage shows that the device having the first experimental example is stable as times passes. Moreover, the first experimental example, in which the dopant content change between the third region and the second region is large, is superior to the second experimental example and the fourth experimental example, in which the dopant content changes are the same between adjacent regions.

In addition, the first to fourth experimental examples are superior to the second comparative example in view of their low variation (ΔV) of the driving voltage. That is, a device having one of the first to fourth experimental examples, in which the n-dopant of the n-type charge generation layer is stepwise increased, can be continuously stable, even though a certain time passes. Therefore, the experiments show that the device having the organic light-emitting device according to an embodiment of the present disclosure may stably have a superior hole-electron balance after a long time.

Meanwhile, in view of lifespan, the third experimental example shows a lowered lifespan in comparison with the other experimental examples. One reason is that the dopant content difference between the third region and the second region is very large. It may be presumed that the large difference of dopant content between the third region and the second region causes an energy potential difference among the third region and the second region and lower the injection efficiency of electrons, even though there is no physical division between the third region and the second region. It appears that the energy potential difference among the third region and the second region is caused when the dopant content difference between the third region and the second region is greater than, e.g., about 4 wt %. However, the luminance and efficiency in the third experimental example are still better than the second comparative example.

In one example, the dopant content of the n-type dopant in the third region may be the same as or less than an average content of the n-type dopant in the n-type charge generation layer, as shown in the third experimental example. Alternatively, when the third region is divided into two sub-regions, for example, the average content of the n-type dopant in the third region may be the same as or less than the average content of the n-type dopant in the n-type charge generation layer, as shown in the first, second, and fourth examples.

In the above first to fourth experimental examples, the dopant content of the n-type dopant is stepwise increased from the first region, that contacts the first stack, to the second region, that contacts the p-type charge generation layer, and the first region of the n-type charge generation layer has no n-type dopants or a very small content of the n-type dopant. Also, the second region that contacts the p-type charge generation layer is a very narrow region, but has the largest content of the n-type dopant in the n-type charge generation layer. Such a structure may effectively make a quantum tunneling effect in the second region. Also, a barrier of electron injection in the n-type charge generation layer to the adjacent first stack may be minimized, and hole-electron balance may be stable as time passes in the light-emitting layer in the stack that is spaced apart from the cathode. Such a structure may also allow for stable driving of the device having the organic light-emitting device over a long time, and may improve the lifespan of the device.

On the other hand, in the experimental examples, the dopant content of the n-type dopant in the n-type charge generation layer has been measured using a Time-of-Flight Secondary Ion Mass Spectrometry (ToF-SIMS) instrument. Through this, it has been confirmed that the distribution of stepwise increment of the n-type dopant in the n-type charge generation layer is effective in view of efficiency, luminance, and a driving voltage.

As described above, embodiments of the present disclosure may provide an n-type charge generation layer having stepwise increased n-type dopants in at least three regions. In the n-type charge generation layer, a first region of no or minimal (very small or minute) n-type dopant that contacts an electron transport layer of the first stack may lower an energy barrier of electron to transport into the first stack. Also, the second region that contacts the p-type charge generation layer may occupy a narrow region in the n-type charge generation layer to have a relatively large dopant content of n-type dopant. That is, a region in which difference of the LUMO energies between the p-type charge generation layer and the n-type charge generation layer is large, may be limited within the second region, and the electrons may quickly and easily pass from the p-type charge generation layer into the n-type charge generation layer. The difference of LUMO energies between the p-type charge generation layer and the n-type charge generation layer may closely act on the electrons that move into the n-type charge generation layer due to a short band barrier region. Thus, injection efficiency of electrons may be increased, and charge balance may be stably maintained, even in a stack that is spaced from the cathode. Therefore, the variation of the driving voltage may be reduced or prevented as times passes, and the organic light-emitting device may function stably. As a result, the organic light-emitting device and the display using the same has an improved lifespan.

Meanwhile, the organic light-emitting display device of the present disclosure may provide the organic light-emitting device (OLED) of the present disclosure at each sub-pixel.

Figure 12:
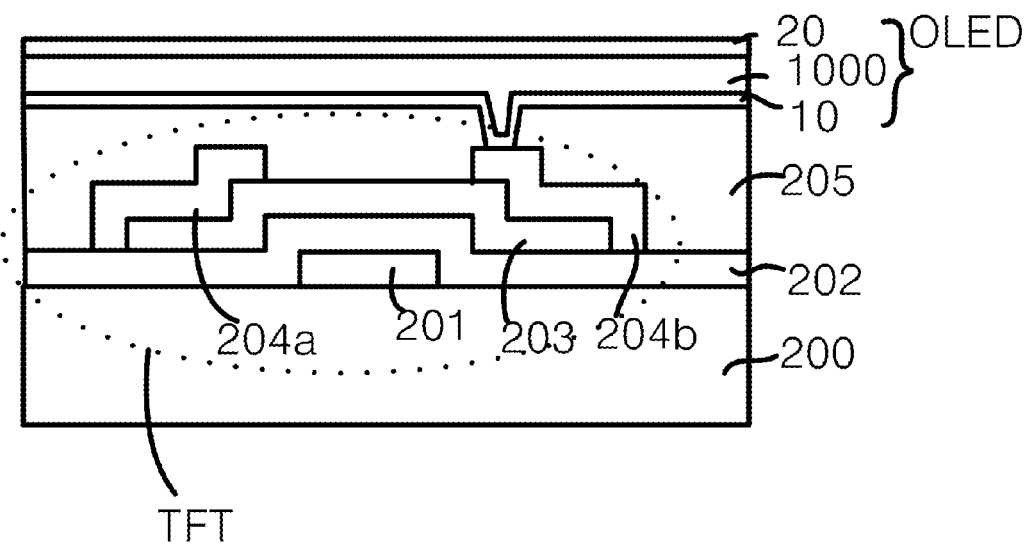
FIG. 12 is a cross-sectional view illustrating an organic light-emitting display device in accordance with an example embodiment of the present disclosure.

FIG. 12 is a cross-sectional view illustrating an organic light-emitting display device in accordance with an example embodiment of the present disclosure.

As shown in the example of FIG. 12, an organic light-emitting display device in accordance with an example embodiment of the present disclosure may include a substrate 200, which may include a plurality of sub-pixels, thin film transistors (TFTs) of the respective sub-pixels being provided on the substrate 200, and respective organic light-emitting devices (OLEDs), each having an anode 10 and a cathode 20. In the illustrated example, the anode 10 or the cathode 20 of each organic light-emitting device may be connected to a respective TFT. Although FIG. 12 illustrates one sub-pixel, sub-pixels having a similar structure may be arranged in a matrix on the substrate 200.

For example, the thin film transistor TFT may include a gate electrode 201 provided in a designated region on the substrate 200, a gate insulating film 202 formed on the substrate 200 to cover the gate electrode 201, a semiconductor layer 203 formed on the gate insulating film 202 to correspond to the gate electrode 201, and a source electrode 204a and a drain electrode 204b formed at respective sides of the semiconductor layer 203. Further, a protective film 205 may be provided to cover the source electrode 204a and the drain electrode 204b. The anode 210 or the cathode 220 may be connected to the drain electrode 204b via a contact hole 205a formed through the protective film 205 to expose at least a part of the drain electrode 204b.

Though the thin film transistor TFT is illustrated as a bottom gate type, embodiments are not limited thereto, and a top gate type transistor may also be provided. The semiconductor layer may include an amorphous silicon layer, a polysilicon layer, and/or an oxide semiconductor. Alternatively, the semiconductor layer may include two or more layers of different semiconductor layers. Embodiments are not limited to these examples.

In addition, if the anode 10 is connected to the drain electrode 204b, the organic stack 1000 may be formed on the anode 10 to include the first stack, the n-type charge generation layer, the p-type charge generation layer, and the second stack, in this order, from the bottom. Optionally, the organic stack 1000 may include three or more stacks, as in the example of FIG. 6.

If the cathode 20 is connected to the drain electrode 204b, the organic stack 1000 may be reversely formed as described above. That is, the second stack, the p-type charge generation layer, the n-type charge generation layer, and the first stack may be formed in this order on the anode 10. Each stack may have a hole transport layer, an light-emitting layer, and an electron transport layer. Optionally, a hole injection layer between the anode and the hole transport layer may be further included. A hole injection layer between the electron transport layer and the cathode may be further optionally included.

Further, although not shown in FIG. 12, a bank may be further included to define an emission region, e.g., by partially overlapping the anode. However, the bank is optionally and may be omitted as desired. The emission region may be defined through one or more other layers. As an example, the organic stack 1000 and the cathode 20 may be commonly formed over all sub-pixels, and then color filters may be patterned at each sub-pixel.

Moreover, although FIG. 12 illustrates the organic light-emitting device in accordance with the example embodiment shown in FIG. 1, embodiments are not limited thereto. For example, the organic light-emitting device may be provided in accordance with the example embodiment shown in FIG. 8, in which three or more stacks are provided.

The above-described organic light-emitting display may achieve color expression by emitting different colors of light through the organic emitting layers of the respective sub-pixels, or may achieve color expression by adding a color filter layer to a light-emitting portion of a common organic emitting layer. Such an organic light-emitting display including the above-described organic light-emitting device may have the same effects as the above-described organic light-emitting device.

With reference to FIG. 1 and FIG. 12, a method for manufacturing an organic light-emitting device is described. A substrate having a plurality of sub-pixels may be prepared. A thin film transistor TFT and an anode 10 connected to the thin film transistor may be formed at each sub-pixel. The first stack 50a may be formed on the anode 10. The first stack 50a may be formed in an order of: the hole transport layer, the light-emitting layer, and the electron transport layer.

A first source including the second organic material having an electron transport property and a second source including the n-type dopant may be placed over the first stack 50a. The second organic material from only the first source may be provided on the first stack 50a with a discontinuous supply from the second source to form the first region 110a.

Next, the n-type dopant with a first dopant content "d1" from the second source and the second organic material from the first source may be provided on the first region 110a so that the third region 110b may be formed on the first region 110a. Then, the n-type dopant with a second dopant content "d2" that is greater than first content d1 from the second source and the second organic material from the first source may be provided on the third region 110b so that the second region 110c may be formed on the third region 110a. Each region may have a uniform dopant content of the n-type dopant. As desired, as shown in FIGS. 9A, 9B, and 9D, the third region may be divided into two sub-regions to have different dopant contents of n-type dopant. The distance from the first region 110a to the second region 110c may constitute the n-type charge generation layer.

Next, a p-type charge generation may be formed with a single first organic material on the n-type charge generation layer. And then, as in the first stack 50a, the second stack 50b may be formed on the p-type charge generation layer. Next, a cathode 20 may be formed on the second stack 50b.

In the organic light-emitting display device according to an embodiment, the n-type charge generation layer can be formed by using a general vapor deposition device, e.g., by differentiating the dopant content distribution of the same source. As is apparent from the above description, an organic light-emitting device and an organic light-emitting display device using the same in accordance with an embodiment of the present disclosure may have effects as below.

First, embodiments may provide an n-type charge generation layer having stepwise increased n-type dopants. In the n-type charge generation layer, a first region of little to no n-type dopant, which is in contact with an electron transport layer of the first stack, may lower an energy barrier of electron to transport into the first stack.

Furthermore, the second region, which is in contact with the p-type charge generation layer, may occupy a narrow region in the n-type charge generation layer to have a relatively large content of the n-type dopant. That is, the region, in which a difference of the LUMO energies between the p-type charge generation layer and the n-type charge generation layer is large, may be limited within the second region, and the electrons quickly and easily pass from the p-type charge generation layer into the n-type charge generation layer. The difference of LUMO energies between the p-type charge generation layer and the n-type charge generation layer may closely act on the electrons that move into the n-type charge generation layer due to a short band barrier region. Thus, injection efficiency of electrons may be increased, and charge balance may be stably maintained, even in a stack spaced from the cathode. Therefore, the variation of the driving voltage may be reduced or prevented as times passes, and the organic light-emitting device may function stably. As a result, the organic light-emitting device and the display using the same may improve a lifespan of the device.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. An organic light-emitting device, comprising:
   an anode and a cathode opposite each other;
   a first stack and a second stack between the anode and the cathode; and
   a charge generation layer between the first stack and the second stack, the charge generation layer comprising an n-type charge generation layer and a p-type charge generation layer,
   wherein the p-type charge generation layer comprises one first organic material,
   wherein the n-type charge generation layer comprises a second organic material and an n-type dopant,
   wherein the n-type charge generation layer is divided into a first region contacting the first stack, a second region contacting the p-type charge generation layer, and a third region between the first region and the second region, and
   wherein a dopant content of the n-type dopant is stepwise increased in an order of: the first region, the third region, and the second region.

2. The organic light-emitting device of claim 1, wherein a dopant content difference of the n-type dopant between the first region and the third region is less than a dopant content difference of the n-type dopant between the third region and the second region.

3. The organic light-emitting device of claim 1, wherein the n-type dopant is only in the second region and the third region.

4. The organic light-emitting device of claim 1, wherein the third region has a larger volume than respective volumes of the first and second regions.

5. The organic light-emitting device of claim 1, wherein the dopant content of the n-type dopant of the second region is about 3 wt % to 10 wt %.

6. The organic light-emitting device of claim 1, wherein the dopant content of the n-type dopant in the third region is equal to or less than an average dopant content of the n-type dopant of the n-type charge generation layer.

7. The organic light-emitting device of claim 1, wherein the third region comprises a plurality of sub-regions, each having a different dopant content of the n-type dopant.

8. The organic light-emitting device of claim 1, wherein a thickness of the second region is 5% to 30% of a total thickness of the n-type charge generation layer.

9. The organic light-emitting device of claim 1, wherein a thickness of the first region is 5% to 25% of a total thickness of the n-type charge generation layer.

10. The organic light-emitting device of claim 1, further comprising one or more sub-stacks between the second stack and the cathode.

11. The organic light-emitting device of claim 10, further comprising:
    a second charge generation layer between the second stack and adjacent sub-stacks to the second stack or among the sub-stacks, the second charge generation layer comprising an n-type layer and a p-type layer,
    wherein the p-type layer of the second charge generation layer comprises one first organic material,
    wherein the n-type layer comprises a second organic material, an n-type dopant,
    wherein the n-type layer is divided into a first region, a second region, and a third region between the first region and the second region,
    wherein a dopant content of the n-type dopant is stepwise increased in an order of: the first region, the third region, and the second region, and
    wherein a dopant content difference of the n-type dopant between the first region and the third region is less than a dopant content difference of the n-type dopant between the third region and the second region.

12. An organic light-emitting device, comprising:
    an anode and a cathode opposing each other;
    a first stack and a second stack between the anode and the cathode; and
    a charge generation layer between the first stack and the second stack, the charge generation layer comprising an n-type charge generation layer and a p-type charge generation layer,
    wherein the p-type charge generation layer comprises one first organic material,
    wherein the n-type charge generation layer comprises a second organic material and an n-type dopant,
    wherein the n-type charge generation layer is divided into a first region contacting the first stack, a second region contacting the p-type charge generation layer, and a third region between the first region and the second region, wherein the n-type dopant is only in the second region and the third region, and wherein a dopant content of the n-type dopant in the second region is greatest within the n-type charge generation layer.

13. The organic light-emitting device of claim 12, wherein a dopant content difference of the n-type dopant between the first region and the third region is less than a dopant content difference of the n-type dopant between the third region and the second region.

14. The organic light-emitting device of claim 12, wherein a dopant content of the third region is less than a dopant content of the second region.

15. An organic light-emitting display device, comprising:
a substrate comprising a plurality of subpixels;
a thin-film transistor in each subpixel on the substrate; and
an organic light-emitting device at each sub-pixel, the organic light-emitting device comprising:
an anode and a cathode opposing each other;
a first stack and a second stack between the anode and the cathode; and
a charge generation layer between the first stack and the second stack,
wherein the thin-film transistor contacts the anode or the cathode,
wherein the charge generation layer comprises:
an n-type charge generation layer, and
a p-type charge generation layer,
wherein the p-type charge generation layer comprises one first organic material,
wherein the n-type charge generation layer comprises a second organic material and an n-type dopant,
wherein the n-type charge generation layer is divided into a first region contacting the first stack, a second region contacting the p-type charge generation layer, and a third region between the first region and the second region, and
wherein a content of the n-type dopant is stepwise increased in an order of: the first region, the third region, and the second region.

* * * * *